United States Patent
Oomori

(10) Patent No.: US 11,527,994 B2
(45) Date of Patent: Dec. 13, 2022

(54) CRYSTAL OSCILLATOR CIRCUIT

(71) Applicant: LAPIS TECHNOLOGY CO., LTD., Yokohama (JP)

(72) Inventor: Tetsuo Oomori, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/535,943

(22) Filed: Nov. 26, 2021

(65) Prior Publication Data

US 2022/0173698 A1    Jun. 2, 2022

(30) Foreign Application Priority Data

Nov. 27, 2020  (JP) .............................. JP2020-196894

(51) Int. Cl.
*H03B 5/32*     (2006.01)
*H03H 9/21*    (2006.01)
*H03B 5/20*    (2006.01)

(52) U.S. Cl.
CPC ................. *H03B 5/32* (2013.01); *H03B 5/20* (2013.01); *H03H 9/21* (2013.01)

(58) Field of Classification Search
CPC ... H03B 5/20; H03B 5/24; H03B 5/30; H03B 5/32; H03B 5/36; H03B 5/364; H03B 5/366; H03B 5/368
USPC .................................................. 331/154, 158
See application file for complete search history.

(56) References Cited

U.S. PATENT DOCUMENTS

| | | | |
|---|---|---|---|
| 5,331,296 A * | 7/1994 | Davis ....................... | H03K 3/03 331/158 |
| 6,556,094 B2 * | 4/2003 | Hasegawa ............ | H03K 3/0307 331/173 |
| 7,034,628 B1 * | 4/2006 | Lu ............................. | H03L 3/00 331/158 |
| 7,183,868 B1 * | 2/2007 | Wessendorf ......... | H03K 3/3545 331/158 |
| 2004/0021521 A1 * | 2/2004 | Nimura .................. | H03K 3/011 331/360 |
| 2011/0291767 A1 * | 12/2011 | Ishikawa .............. | H03K 3/0307 331/154 |
| 2022/0131499 A1 * | 4/2022 | Jefremow ................ | H03B 5/36 |

FOREIGN PATENT DOCUMENTS

JP        2002-204128 A      7/2002

* cited by examiner

*Primary Examiner* — Levi Gannon
(74) *Attorney, Agent, or Firm* — Volentine, Whitt & Francos, PLLC

(57) ABSTRACT

An oscillator circuit includes an amplifying unit and a first feedback resistor. The amplifying unit includes an inverter at an input stage being connected to the one end of a crystal resonator, an inverter at an output stage being connected to the other end of the crystal resonator, and a linear amplifier. The linear amplifier is connected between an output terminal of the inverter at the input stage and an input terminal of the inverter at the output stage. The linear amplifier includes at least one inverter and a second feedback resistor. The second feedback resistor is connected in parallel to the at least one inverter. The linear amplifier has a conductance with a magnitude larger than a conductance of the inverter at the input stage and equal to or less than a conductance of the inverter at the output stage.

5 Claims, 17 Drawing Sheets

CRYSTAL OSCILLATOR CIRCUIT

CROSS-REFERENCE TO RELATED APPLICATION

This application is based upon and claims the benefit of priority from the prior Japanese Patent Application No. 2020-196894 filed on Nov. 27, 2020, the entire contents of which are incorporated herein by reference.

BACKGROUND

1. Technical Field

The present invention relates to a crystal oscillator circuit.

2. Description of the Related Art

In association with an increased speed of a microcomputer or the like, an oscillator circuit at high frequency has been requested. The oscillator circuit at high frequency has been required to have high performance in accuracy of the frequency, temperature deviation, a noise property, and the like. However, with an oscillator circuit other than a crystal, such as a CR oscillator circuit or PLL, achieving these properties is difficult. Therefore, a crystal oscillator circuit has been used as the oscillator circuit meeting the characteristic requests.

The crystal oscillator circuit includes, for example, a crystal resonator, an amplifying unit formed of inverters and having an input terminal and an output terminal connected to both ends of the crystal resonator, a feedback resistor connected between an input terminal and an output terminal of the inverters in parallel to the crystal resonator, and capacitors connected between respective input terminal and output terminals of the inverters and a ground. The amplifying unit is configured of, for example, the inverters of the odd-numbered stages (for example, JP-A-2002-204128).

SUMMARY

In association with low current consumption of electronic devices, a reduction in current consumption has been required for the crystal oscillator circuit as well. On the other hand, in association with recent downsized crystal resonators, the characteristic request required for an oscillator circuit side of the crystal oscillator circuit has been further demanding.

However, there has been a problem that an attempt to achieve the high properties results in an increase in the current consumption of the circuit. Additionally, further improved performance of a semiconductor process is necessary, causing a problem of cost increase.

The present invention has been made in consideration of the problems, and an object is to provide a crystal oscillator circuit at high frequency and having low current consumption.

According to the present invention, a crystal oscillator circuit connected to a crystal resonator for oscillating based on an oscillation of the crystal resonator, the crystal oscillator circuit comprising: an amplifying unit that includes inverters of odd-numbered stages connected in cascade, the amplifying unit having an input side connected to one end of the crystal resonator and an output side connected to another end of the crystal resonator; and a first feedback resistor connected between the one end and the other end of the crystal resonator in parallel to the amplifying unit, wherein the amplifying unit includes: an inverter at an input stage having an input terminal connected to the one end of the crystal resonator; an inverter at an output stage having an output terminal connected to the other end of the crystal resonator; and a linear amplifier connected between an output terminal of the inverter at the input stage and an input terminal of the inverter at the output stage, the linear amplifier including at least one inverter and a second feedback resistor which is connected in parallel to the at least one inverter, wherein the linear amplifier has a conductance with a magnitude larger than a conductance of the inverter at the input stage and equal to or less than a conductance of the inverter at the output stage.

With the crystal oscillator circuit of the present invention, the crystal oscillator circuit at high frequency and having low current consumption can be provided.

BRIEF DESCRIPTION OF THE DRAWINGS

Features of the present invention will be described below with reference to the accompanying drawings.

DETAILED DESCRIPTION

Figure 1:
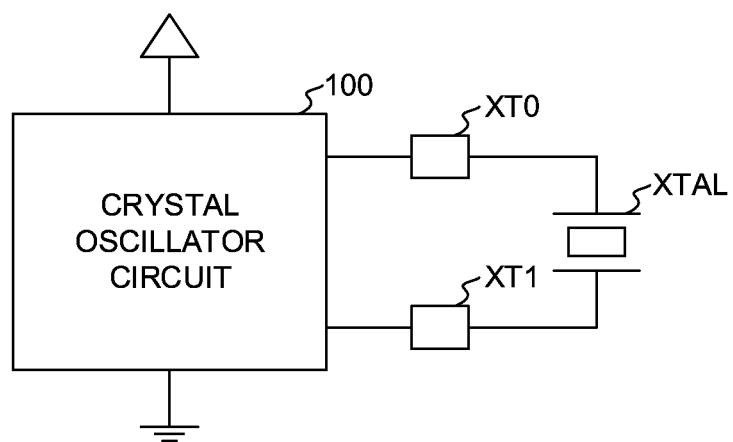
FIG. 1 is a drawing illustrating a state in which a crystal oscillator circuit according to the present invention is connected to a crystal resonator.

Preferred embodiments of the present invention will be described in detail below. Note that the same reference numerals are given to substantially identical or equivalent parts in the description in the following respective embodiments and the accompanying drawings.

First Embodiment

FIG. 1 is a circuit diagram illustrating a state in which a crystal oscillator circuit 100 according to the present invention is connected to a crystal resonator XTAL. The crystal oscillator circuit 100 is connected to one end of the crystal resonator XTAL via a connection terminal XT0 and connected to the other end of the crystal resonator XTAL via a connection terminal XT1. The crystal oscillator circuit 100 constitutes a crystal oscillator together with the crystal resonator XTAL.

Figure 2:
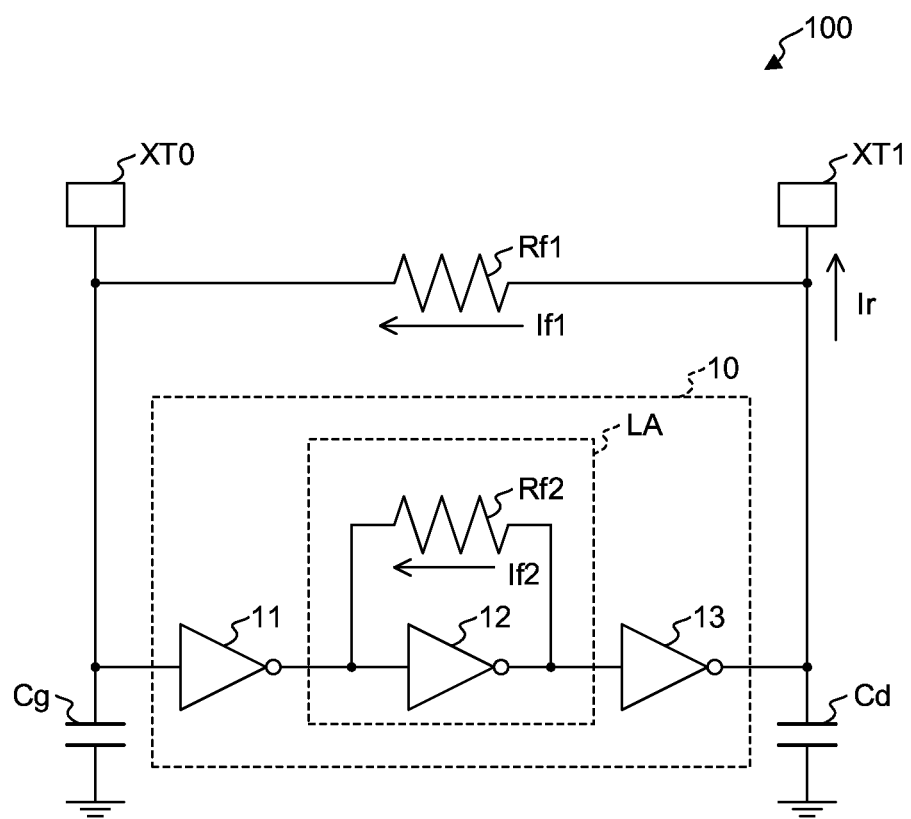
FIG. 2 is a circuit diagram illustrating a configuration of a crystal oscillator circuit of a first embodiment.

FIG. 2 is a circuit diagram illustrating a configuration of the crystal oscillator circuit 100. The crystal oscillator circuit 100 includes an amplifying unit 10, a first feedback resistor Rf1, capacitors Cg and Cd, and the connection terminals XT0 and XT1.

The amplifying unit 10 has an input side connected to the crystal resonator XTAL via the connection terminal XT0 and an output side connected to the crystal resonator XTAL via the connection terminal XT1. The amplifying unit 10 amplifies an input signal supplied from the crystal resonator XTAL, generates an output signal, and supplies it to the crystal resonator XTAL.

The amplifying unit 10 is an oscillation amplifier including inverters of three stages formed of a first inverter 11, a second inverter 12, and a third inverter 13 connected in cascade in the order. Between an output terminal and an input terminal of the second inverter, a second feedback resistor Rf2 is connected.

The input terminal of the first inverter 11 is connected to the connection terminal XT0. The input terminal of the first inverter 11 constitutes an input side end portion of the amplifying unit 10. The first inverter 11 is an inverter of an input stage having the input terminal connected to one end of the crystal resonator XTAL and receives a signal input from the crystal resonator XTAL. The first inverter 11 inverts the input signal from the crystal resonator XTAL supplied to the input terminal and outputs it.

The second inverter 12 has an input terminal connected to the output terminal of the first inverter 11. The second inverter 12 inverts the output signal from the first inverter 11 supplied to the input terminal and outputs it. The second inverter 12 constitutes a linear amplifier LA together with the second feedback resistor Rf2 connected in parallel.

The third inverter 13 has an input terminal connected to the output terminal of the second inverter 12. The third inverter 13 has an output terminal connected to the connection terminal XT1. The third inverter 13 is an inverter of an output stage having the output terminal connected to the other end of the crystal resonator XTAL and supplying the output signal to the crystal resonator XTAL. The third inverter 13 inverts the output signal from the second inverter 12 supplied to the input terminal and outputs it.

Each of the first inverter 11, the second inverter 12, and the third inverter 13 is constituted of a PMOS transistor and an NMOS transistor whose drains are connected to one another.

The second feedback resistor Rf2 is connected between the output terminal and the input terminal of the second inverter 12 in parallel to the second inverter 12. The second feedback resistor Rf2 has one end connected between the output terminal of the first inverter 11 and the input terminal of the second inverter 12. The second feedback resistor Rf2 has the other end connected between the output terminal of the second inverter 12 and the input terminal of the third inverter 13.

The first feedback resistor Rf1 is connected between the connection terminal XT0 and the connection terminal XT1 in parallel to the amplifying unit 10. The first feedback resistor Rf1 has one end connected to the input terminal of the first inverter 11. The first feedback resistor Rf1 has the other end connected to the output terminal of the third inverter 13.

The capacitor Cg is disposed between the input side of the amplifying unit 10 and the ground. The capacitor Cg has one end connected to the input terminal of the first inverter 11, one end of the first feedback resistor Rf1, and the connection terminal XT0. The other end of the capacitor Cg is grounded. The capacitor Cg functions as an oscillation capacitance on the input side of the crystal oscillator circuit 100.

The capacitor Cd is disposed between the output side of the amplifying unit 10 and the ground. The capacitor Cd has one end connected to the output terminal of the third inverter 13, the other end of the first feedback resistor Rf1, and the connection terminal XT1. The other end of the capacitor Cd is grounded. The capacitor Cd functions as an oscillation capacitance on the output side of the crystal oscillator circuit 100.

Figure 3:
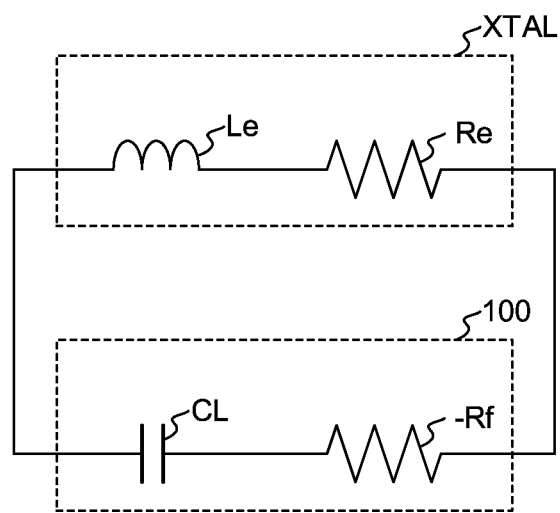
FIG. 3 is a circuit diagram in which the configuration of FIG. 1 is replaced by an equivalent circuit.

FIG. 3 is a circuit diagram in which the configuration of FIG. 1 is replaced by an equivalent circuit. The crystal resonator XTAL is replaced by an inductance Le and an effective resistor Re. The crystal oscillator circuit 100 is replaced by a load capacitance CL and a negative resistor −RL.

The load capacitance CL and the negative resistance −RL are expressed by the next formulae (1) and (2), respectively.

$$CL = Cg * Cd / (Cg + Cd) \quad (1)$$

$$-RL = -gm / (2\pi f)^2 * Cg * Cd \quad (2)$$

Note that a conductance of each inverter constituting the crystal oscillator circuit 100 is expressed by the next formula (3) using an input voltage Vin and an output current Iout.

$$gm = \Delta Iout / \Delta Vin \quad (3)$$

An oscillation condition in the configuration is expressed by the next formula (4).

$$-RL \geq Re \quad (4)$$

That is, when the above-described condition is met, the effective resistance Re of the crystal resonator XTAL is canceled by the negative resistance −RL, and impedance loss of the crystal oscillator circuit 100 is eliminated. This causes an LC oscillation by the inductance Le and the load capacitance CL, thus ensuring oscillation.

For stable oscillation, the negative resistance −RL needs to be smaller than 0Ω, and an absolute value of the negative resistance −RL needs to be a constant one time or more of the effective resistance Re. When an oscillation margin indicative of a margin from an oscillation state to oscillation stop is denoted as n, the oscillation margin n is expressed by the next formula (5).

$$n = |-RL|/Re \qquad (5)$$

Generally, the oscillation margin n is preferably three times or more of the effective resistance Re in the commercial crystal oscillator, and is preferably five times or more of the effective resistance Re in an on-board crystal oscillator.

With reference to FIG. 2 again, the crystal oscillator circuit 100 of this embodiment is, as described above, constituted of the oscillation amplifier including the inverters of three stages, the first feedback resistor Rf1, and the oscillation capacitances (Cg/Cd).

The first inverter 11 is an inverter constituting the input stage of the oscillation amplifier, and is not fed back. A conductance gm1 of the first inverter 11 is designed so as to be an amplitude level at which the second inverter 12 can be operated by the output signal from the first inverter 11.

The second inverter 12 is an inverter constituting a linear amplifier to which the second feedback resistor Rf2 is connected. A conductance gm2 of the second inverter 12 is determined (that is, set and restricted) by a resistance value of the second feedback resistor Rf2. In other words, with the resistance value of the second feedback resistor Rf2, an amplification factor of the linear amplifier is set.

The third inverter 13 is an inverter constituting an output stage of the oscillation amplifier. The third inverter 13 supplies an excitation current Ir to the crystal resonator XTAL via the connection terminal XT1 so as to charge and discharge the oscillation capacitance Cd. The third inverter 13 supplies a feedback current If to the connection terminal XT0 via the first feedback resistor Rf1 so as to charge and discharge the oscillation capacitance Cg and a gate capacitance of the first inverter 11. A conductance gm3 of the third inverter 13 is set to a level at which such an operation can be performed.

In this embodiment, the conductance gm2 of the second inverter is set to have a magnitude larger than the conductance gm1 of the first inverter and equal to or less than the conductance gm3 of the third inverter. That is, the relationship between the conductance gm1 of the first inverter 11, the conductance gm2 of the second inverter 12, and the conductance gm3 of the third inverter 13 are expressed by the next formula (6).

$$gm1 < gm2 \leq gm3 \qquad (6)$$

Next, operations of the crystal oscillator circuit 100 of this embodiment will be described.

First, the input signal from the crystal resonator XTAL is input to the input terminal of the first inverter 11 via the connection terminal XT0. The oscillation amplitude of the input signal is amplified to a predetermined amplitude level by the first inverter 11 and is output from the output terminal of the first inverter 11.

The amplitude of the signal input from the first inverter 11 to the second inverter 12 as the linear amplifier is amplified by the amplification factor designated by the feedback resistor Rf2. The amplified signal is output from the output terminal of the second inverter 12 and is input to the input terminal of the third inverter 13.

The third inverter 13 generates the excitation current Ir based on the signal input from the second inverter 12. The third inverter 13 supplies the excitation current Ir to the crystal resonator XTAL via the connection terminal XT1, and charges and discharges the oscillation capacitance Cd. The third inverter 13 supplies the feedback current If to the connection terminal XT0 via the first feedback resistor Rf1, and charges and discharges the oscillation capacitance Cg and the gate capacitance of the first inverter 11.

By the operations described above, the crystal oscillator circuit 100 maintains the amplitude of the signal generated by a piezoelectric effect of the crystal resonator XTAL, thus continuing the oscillation.

Next, effects brought by the crystal oscillator circuit 100 of this embodiment having the configuration will be described through comparison with crystal oscillator circuits of comparative examples.

Figure 4:
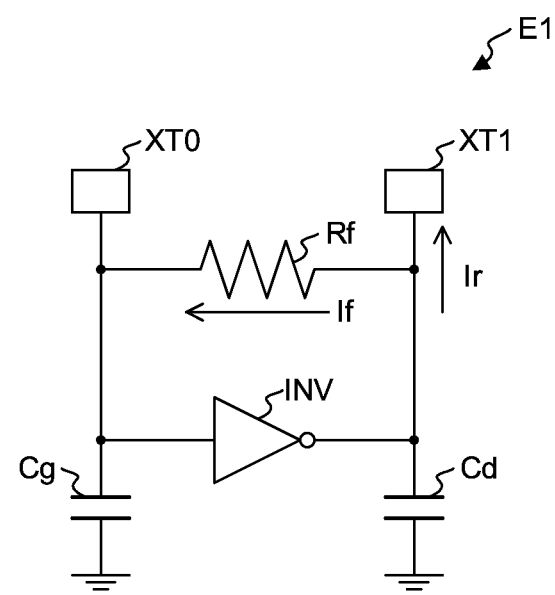
FIG. 4 is a circuit diagram illustrating a configuration of a crystal oscillator circuit of a first comparative example.

FIG. 4 is a circuit diagram illustrating a configuration of a crystal oscillator circuit E1 of a first comparative example. The crystal oscillator circuit E1 of the first comparative example includes an inverter INV, the feedback resistor Rf, the capacitors Cg and Cd, and the connection terminals XT0 and XT1. The respective connection terminals XT0 and XT1 are connected to one end and the other end of the crystal resonator XTAL (not illustrated in FIG. 4).

The inverter INV is constituted of the PMOS transistor and the NMOS transistor whose drains are connected to one another. The input terminal of the inverter INV is connected to the connection terminal XT0. The inverter INV has an output terminal connected to the connection terminal XT1.

The feedback resistor Rf is connected between the connection terminals XT0 and XT1 in parallel to the inverter INV. The capacitor Cg is disposed between the input terminal of the inverter INV and the ground to constitute the oscillation capacitance Cg. The capacitor Cd is disposed between the input terminal of the inverter INV and the ground to constitute the oscillation capacitance Cd.

The crystal oscillator circuit E1 of the first comparative example constitutes an oscillation amplifier of a negative feedback amplifier by the inverter INV and the feedback resistor Rf. The inverter INV supplies the excitation current Ir that oscillates the crystal resonator XTAL to the connection terminal XT1. The inverter INV supplies the feedback current If to the connection terminal XT0 via the feedback resistor Rf.

Similarly to the crystal oscillator circuit 100 of this embodiment, the crystal oscillator circuit E1 of the first comparative example is also replaced by the equivalent circuit as illustrated in FIG. 3 in the state in which the crystal resonator XTAL is connected. That is, each of the crystal resonator XTAL is replaced by the inductance Le and the effective resistor Re and the crystal oscillator circuit 100 is replaced by the load capacitance CL and the negative resistor −RL.

With the configuration of the crystal oscillator circuit E1 of the first comparative example, decreasing the feedback resistance Rf increases the feedback current If, and a frequency bandwidth of the negative resistance −RL shifts to a high bandwidth. Increasing the feedback resistance Rf reduces the feedback current If, and a frequency bandwidth of the negative resistance −RL shifts to a low bandwidth.

With the above-described formula (2), decreasing the oscillation capacitances Cg and Cd increases the negative resistance −RL, and increasing the oscillation capacitances Cg and Cd reduces the negative resistance −RL. Similarly, increasing the conductance gm of the inverter INV constituting the oscillation amplifier also increases the negative resistance—RL, and reducing the conductance gm of the inverter INV also reduces the negative resistance −RL. With the above-described formula (1), the oscillation capacitances Cg and Cd are determined by the load capacitance CL of the crystal resonator XTAL used. With the crystal oscillator circuit of the first comparative example, by adjusting the circuit constants, the negative resistance −RL is adjusted so as to be a desired oscillation margin according to the crystal resonator XTAL used.

Figure 5:
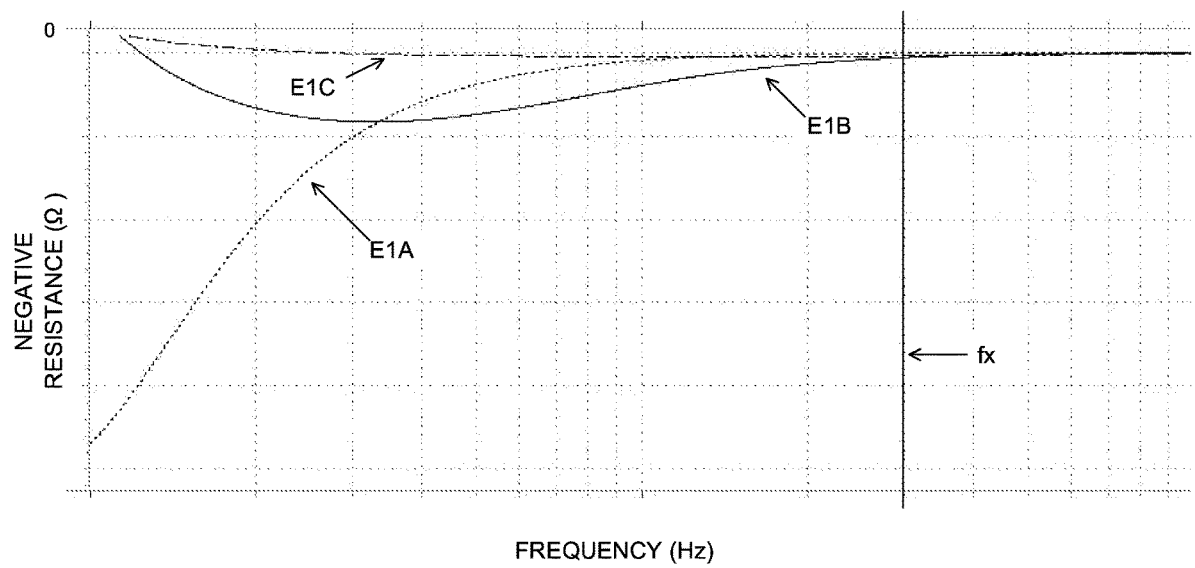
FIG. 5 is a drawing illustrating an example of a property of a negative resistance in the crystal oscillator circuit of the first comparative example.

FIG. 5 is a drawing illustrating an example of a property of a negative resistance in the crystal oscillator circuit E1 of the first comparative example. The "fx" indicates the oscillation frequency of the crystal resonator XTAL.

The oscillation capacitances Cg and Cd are determined by the load capacitance CL of the crystal resonator XTAL used and the feedback resistance Rf is also set so as to be in an appropriate frequency bandwidth for the oscillation frequency. The negative resistance is adjusted by the conductance gm of the inverter INV. The conductance gm of the inverter INV is adjusted by sizes of a gate length (a channel length) L and a gate width (a channel width) W of the PMOS transistor the NMOS transistor constituting the inverter INV. Here, a case where the gate length L is fixed as the minimum size and the conductance gm of the inverter INV is adjusted by the gate width W will be described.

FIG. 5 illustrates properties of the negative resistances in three cases of the different gate widths W. In FIG. 5, E1A indicates a case of the smallest gate width W, E1C indicates a case of the largest gate width W, and E1B indicates a case of the gate width W larger than E1A and smaller than E1C (W: E1A<E1B<E1C).

In E1A, the gate width W is small, the value of the conductance gm is small. Accordingly, increasing the frequency reduces the negative resistance and at an oscillation frequency fx of the crystal resonator XTAL, the negative resistance is close to 0Ω, and therefore oscillation does not occur.

In E1B in which the gate width W is larger than E1A, since the conductance gm increases, the negative resistance in the high frequency bandwidth also increases. However, at the oscillation frequency fx of the crystal resonator XTAL, the negative resistance is still close to 0Ω, and therefore oscillation does not occur.

In E1C in which the gate width W is further larger E1B, the negative resistance also increases according to the increase in the conductance gm. Capacitance components, such as a gate capacitance, a drain capacitance, and a parasitic capacitance of each of the PMOS transistor and the NMOS transistor increase. During driving of the crystal oscillator circuit, the increased capacitances are caused to be charged and discharged. In view of this, when the gate width W is set to a certain constant size or more, at the high oscillation frequency, charging and discharging of the capacitance by the increased amount becomes not negligible, and the negative resistance decreases.

To improve this, methods, such as a reduction in the parasitic capacitance by further miniaturization, and an increase in the conductance gm by improving the transistor property to reduce an influence of the capacitance components, are considered. However, in the case, problems, such as an increase in process cost and an increase in current consumption, occur.

Figure 6:
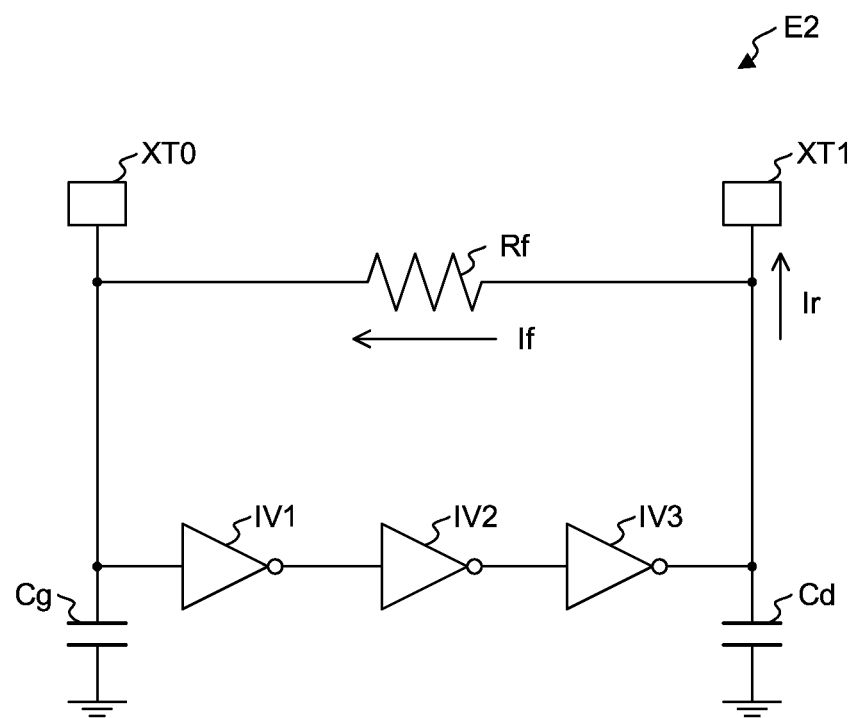
FIG. 6 is a circuit diagram illustrating a configuration of a crystal oscillator circuit of a second comparative example.

FIG. 6 is a circuit diagram illustrating a configuration of a crystal oscillator circuit E2 according to a second comparative example. In the second comparative example, an amplifying unit is constituted by three stages of inverters of inverters IV1, IV2, and IV3 to increase the conductance gm of the entire oscillation amplifier. The inverters IV1 and IV2 are not fed back. The conductance gm of each of the inverters IV1 and IV2 is larger than that of the inverter INV of the first comparative example E1.

Figure 7:
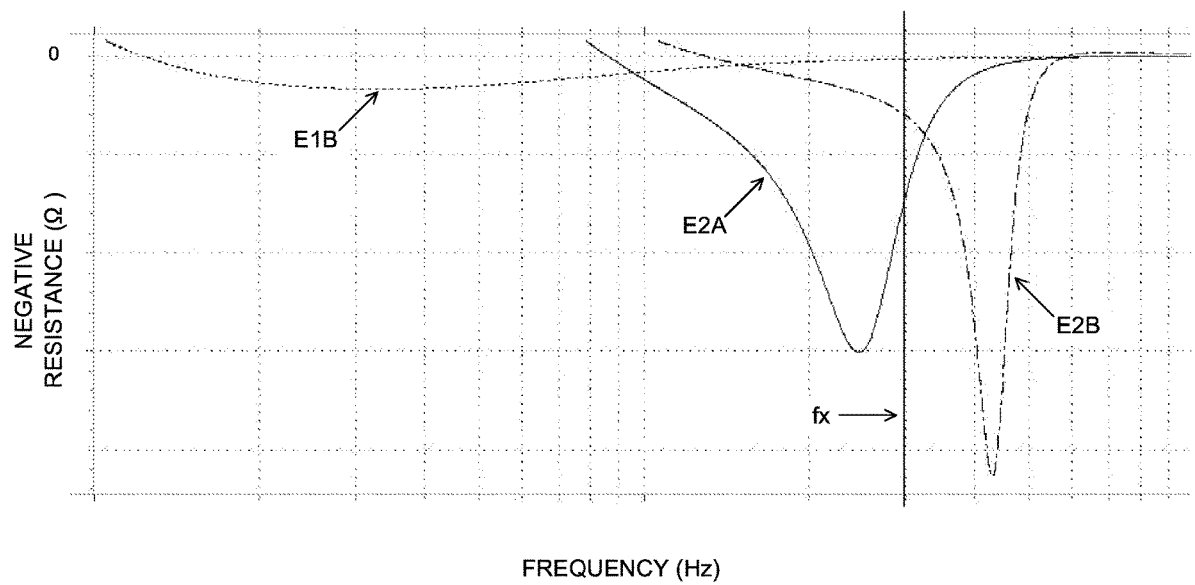
FIG. 7 is a drawing illustrating an example of a property of a negative resistance in the crystal oscillator circuit of the second comparative example.

FIG. 7 is a drawing illustrating an example of a property of a negative resistance in the crystal oscillator circuit E2 of the second comparative example. Here, a negative resistance property (E1B) of the crystal oscillator circuit E1 of the first comparative example is illustrated as the comparison target.

In the second comparative example (E2A), compared with the first comparative example (E1B), the negative resistance substantially increases. However, since the conductance gm of the entire oscillation amplifier is excessively high, the conductance gm significantly varies depending on usage conditions, such as a temperature and a power supply voltage, manufacturing variation, and the like. In view of this, as indicated by E2B in the drawing, the negative resistance shifts to a bandwidth further higher than the oscillation frequency of the crystal resonator XTAL, possibly causing an abnormal oscillation and oscillation stop.

Figure 8:
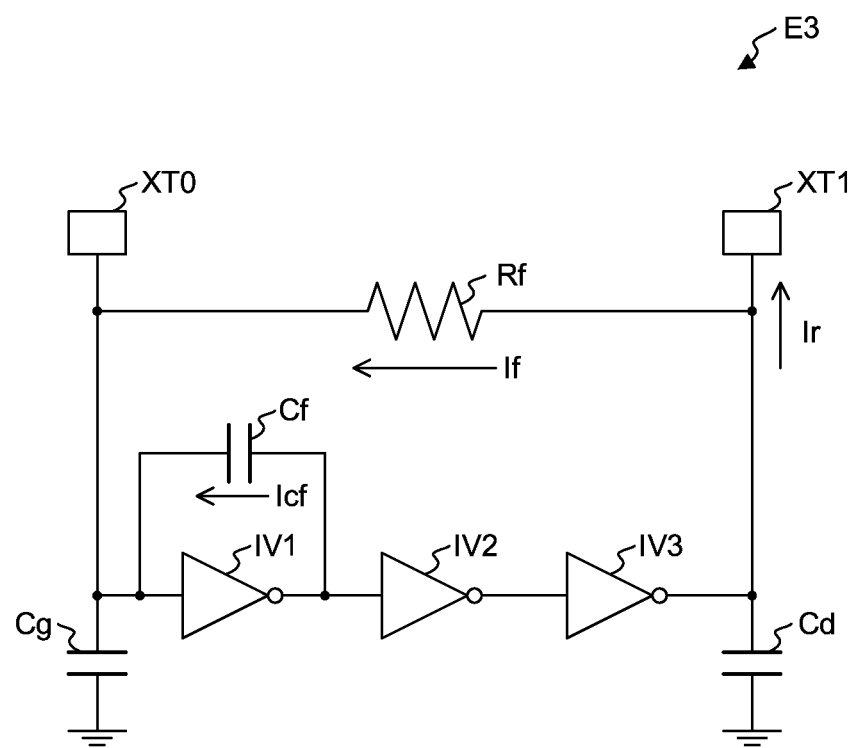
FIG. 8 is a circuit diagram illustrating a configuration of a crystal oscillator circuit of a third comparative example.

FIG. 8 is a circuit diagram illustrating a configuration of a crystal oscillator circuit E3 according to a third comparative example. The crystal oscillator circuit E3 differs from the crystal oscillator circuit E2 of the second comparative example in that the capacitor Cf is connected in parallel to the inverter IV1.

While the excitation current Ir is supplied from only the inverter IV3 in the second comparative example, in the third comparative example, a feedback current Icf from a feedback capacitance Cf of the inverter IV1 is added to be supplied. In view of this, apparently, in the crystal oscillator circuit E3 of the third comparative example, an amplifying unit is constituted of oscillation amplifiers of three stages (IV1, IV2, and IV3) and an oscillation amplifier of one stage (Cf). Accordingly, in the crystal oscillator circuit E3 of the third comparative example, the conductance gm of the amplifying unit is larger than that in the crystal oscillator circuit E2 of the second comparative example.

Figure 9:
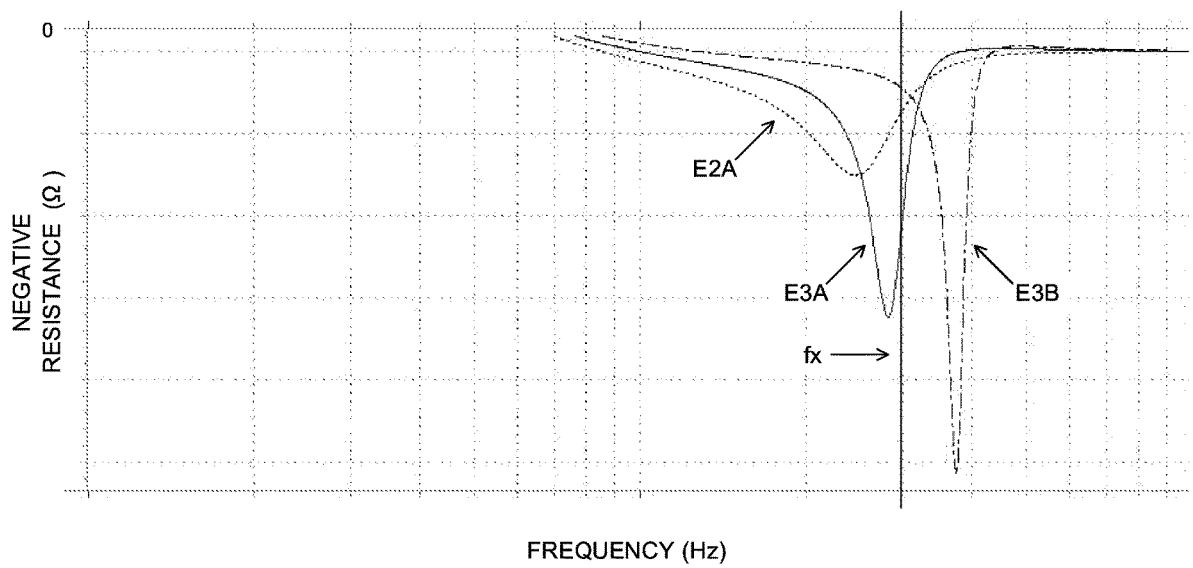
FIG. 9 is a drawing illustrating an example of a property of a negative resistance in the crystal oscillator circuit of the third comparative example.

FIG. 9 is a drawing illustrating an example of a property of a negative resistance in the crystal oscillator circuit E3 of the third comparative example. Here, a negative resistance property (E2A) of the crystal oscillator circuit E2 of the second comparative example is illustrated as the comparison target.

In the third comparative example (E3A), the negative resistance is further larger than that in the second comparative example (E2A). However, since the conductance gm of the entire oscillation amplifier is large and significantly varies depending on the usage conditions, such as a temperature and a power supply voltage, and manufacturing variation, and the like, as indicated by E3B in the drawing, the negative resistance shifts to the bandwidth further higher than the oscillation frequency of the crystal resonator XTAL. This possibly causes an abnormal oscillation and oscillation stop.

Figure 10:
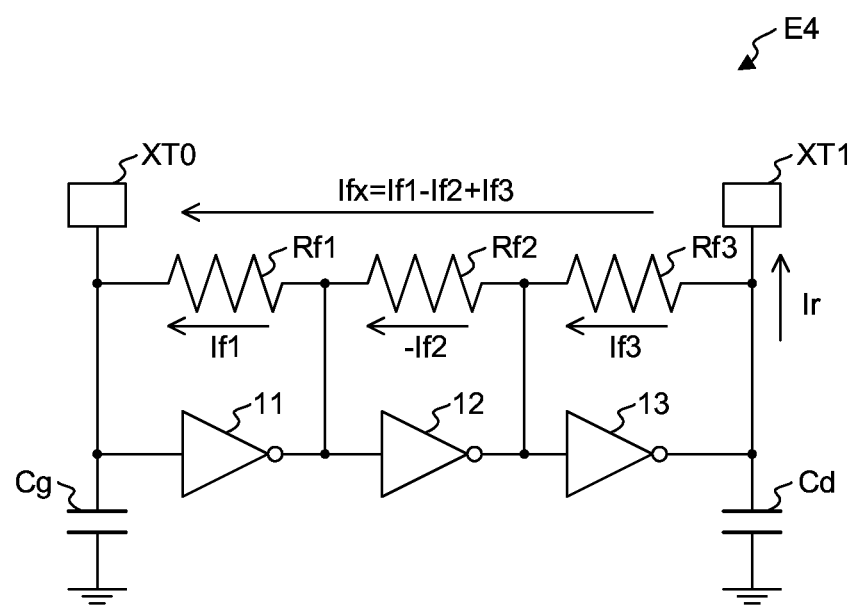
FIG. 10 is a circuit diagram illustrating a configuration of a crystal oscillator circuit of a fourth comparative example.

FIG. 10 is a circuit diagram illustrating a configuration of a crystal oscillator circuit E4 according to a fourth comparative example. In addition to the inverters of the three-stages (IV1, IV2, and IV3), feedback resistors (Rf1, Rf2, and Rf3) are connected to the inverters, respectively, to constitute a linear amplifier, thus reducing the individual conductance gm of the inverter at each stage. A logic of the inverter IV2 at the second stage is inverted to logics of the inverter IV1 at the first stage and the inverter IV3 at the third stage. Inputs and outputs are connected to the inverters at all stages via the feedback resistors, and therefore the inverter IV2 has a function of adjusting the conductance gm of the entire circuit.

A feedback resistance Rfx of the entire circuit is expressed by "Rfx=Rf1+Rf2+Rf3." Since the logic of the inverter IV2 is inverted, the feedback current becomes a negative current "−Ir2" and a feedback current Ifx of entire circuit becomes "Ifx=Ir1−Ir2+Ir3."

Figure 11:
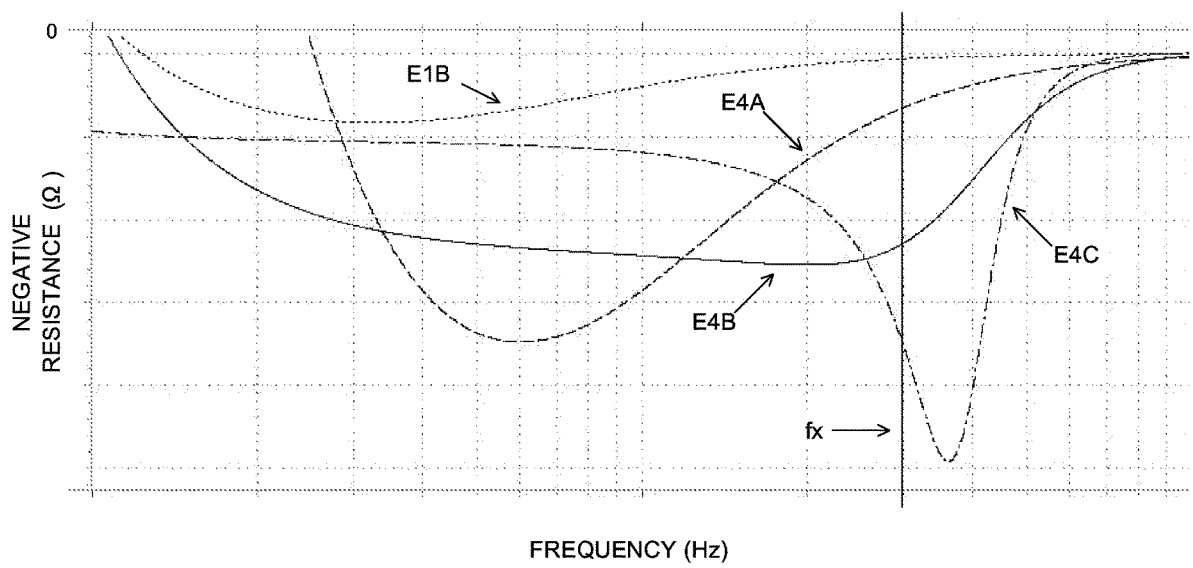
FIG. 11 is a drawing illustrating an example of a property of a negative resistance in the crystal oscillator circuit of the fourth comparative example.

FIG. 11 is a drawing illustrating an example of a property of a negative resistance in the crystal oscillator circuit E4 of the fourth comparative example. Here, the negative resistance property (E1B) of the crystal oscillator circuit E1 of the first comparative example is illustrated as the comparison target. E4A indicates a case where the feedback resistance Rfx of the entire circuit is the smallest and the feedback current Ifx is the largest. E4C indicates a case where the feedback resistance Rfx of the entire circuit is the largest and the feedback current Ifx is the smallest. E4B indicates a case where the feedback resistance Rfx of the entire circuit is larger than E4A and smaller than E4C, that is, the feedback current Ifx is larger than E4C and smaller than E4A (Ifx: E4A>E4B>E4C).

In the fourth comparative example (E4A, E4B, and E4C), the negative resistance is larger than that in the first comparative example (E1B). The negative resistance of E4A in which the feedback resistance Rfx is small, that is, the feedback current Ifx is large, decreases the most. Compared with this, in E4C in which the feedback resistance Rfx is large, that is, the feedback current Ifx is small, the negative resistance increases and shifts to the high frequency bandwidth.

Since the feedback current of the inverter IV2 is −If2, in order to increase the entire feedback current Ifx, it is necessary that the resistance value of the feedback resistor Rf2 is increased to reduce the feedback current value. To decrease the negative resistance and the frequency bandwidth by adjusting the feedback resistance, the feedback current needs to be increased. These properties are properties opposite to those of the general crystal oscillator circuits, and depending on the circuit adjustment, this causes an increase in current consumption.

Figure 12:
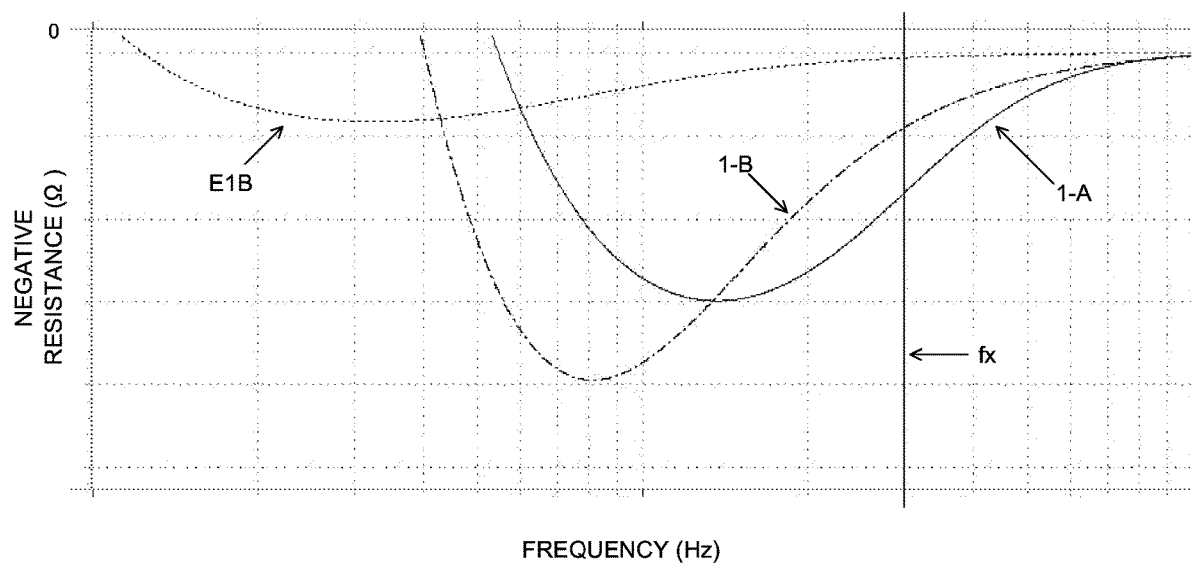
FIG. 12 is a drawing illustrating an example of a property of a negative resistance in the crystal oscillator circuit of the first embodiment.

FIG. 12 is a drawing illustrating an example of a property of a negative resistance in the crystal oscillator circuit 100 of the first embodiment. Here, as the comparison target, the negative resistance property E1B of the first comparative example is illustrated. 1-A in the drawing indicates a case where a magnitude relationship between the conductance gm1 of the first inverter 11 and the conductance gm2 of the second inverter 12 is "gm1<gm2" and 1-B indicates a case of "gm1>gm2."

In the crystal oscillator circuit 100 of this embodiment, the negative resistance increases in a high frequency bandwidth, and has a sufficient level (a resistance value) at the oscillation frequency fx of the crystal resonator XTAL. On the other hand, unlike the second comparative example and the third comparative example, the negative resistance does not become excessively high.

Additionally, even in a case where the input signal input to the first inverter 11 oscillates at high speed and the amplitude is minute, since the conductance gm1 of the first inverter 11 is set so as to be a desired amplitude level, the amplitude of the output signal does not attenuate.

The second inverter 12 constitutes the linear amplifier together with the feedback resistor Rf2, and amplifies the amplitude of the signal input from the first inverter 11 at an amplification factor designated by the feedback resistor Rf2. Unlike the feedback resistance Rf1 as one of oscillation constants of the oscillator circuit, the feedback resistance Rf2 is not included in the oscillation constant and is to genuinely designate the amplification factor of the linear amplifier, and therefore the constant can be conveniently set. In view of this, even when the amplitude of the input signal is an excessive amplitude, the amplitude of the output signal can be restricted. In other words, the linear amplifier formed of the second inverter 12 is an amplifier of a negative feedback amplifier, and therefore the amplitude of the output signal does not distort or overshoot. With the properties, the second inverter 12 achieves a main amplitude function as the entire circuit.

The third inverter 13 is an output stage of the amplifying unit 10, amplifies the amplitude of the signal input from the second inverter 12, and maintains the piezoelectric effect of the crystal resonator XTAL. The conductance gm3 of the third inverter 13 only needs to be a level at which the excitation current Ir and the feedback current If1 can be supplied, and the oscillation capacitances Cg and Cd and the gate capacitance of the first inverter 11 can be charged and discharged. Accordingly, the conductance gm3 can be reduced to be small. In view of this, the circuit scall can be smaller than that of the first comparative example.

Additionally, since the conductance of the entire circuit is small, unlike the crystal oscillator circuit E2 of the second comparative example and the crystal oscillator circuit E3 of the third comparative example, there is no possibility of casing abnormal oscillation and oscillation stop due to the excessively high conductance.

Note that, by setting the frequency bandwidth of the second inverter 12 to which the second feedback resistor Rf2 is connected between the input and the output to be higher than the frequency bandwidth (namely, the oscillation frequency) of the entire circuit, stable negative resistance and oscillation margin can be obtained.

The resistance value of the second feedback resistor Rf2 is preferably set to be a value smaller than the resistance value of the first feedback resistor Rf1. For example, assume that the respective feedback resistors have the same resistance value (namely, Rf2=Rf1), when the same bandwidth is set to the frequency bandwidths of the second inverter 12 and the entire circuit, oscillation occurs. However, due to manufacturing variation or the like, the conductances gm in the frequency bandwidths differ between the second inverter 12 and the entire circuit, thus decreasing the negative resistance. In a case where the resistance value of the second feedback resistor Rf2 is larger than the resistance value of the first feedback resistor Rf1 (namely, Rf2>Rf1), the frequency bandwidth of the second inverter 12 becomes lower than the frequency bandwidth of the entire circuit, and the conductance gm2 in the oscillation frequency of the second inverter 12 lowers, and therefore the negative resistance further reduces, possibly resulting in oscillation stop.

In contrast to this, by setting the resistance value of the second feedback resistor Rf2 so as to be equal to or less than the resistance value of the first feedback resistor Rf1 (that is, Rf2<Rf1), the reduction in the conductance gm2 in the frequency bandwidth of the second inverter 12 due to various conditions, such as manufacturing variation, can be reduced.

As described above, with the crystal oscillator circuit 100 of this embodiment, the conductance of the entire circuit is small. Accordingly, while the conductance of the entire circuit is set such that the negative resistance becomes a level at which the oscillation margin required for the commercial or on-board crystal oscillator is achievable, the properties sufficient for the crystal oscillation at the high frequency can be obtained. Since the circuit scale can be decreased, the current consumption can be reduced.

Second Embodiment

Figure 13:
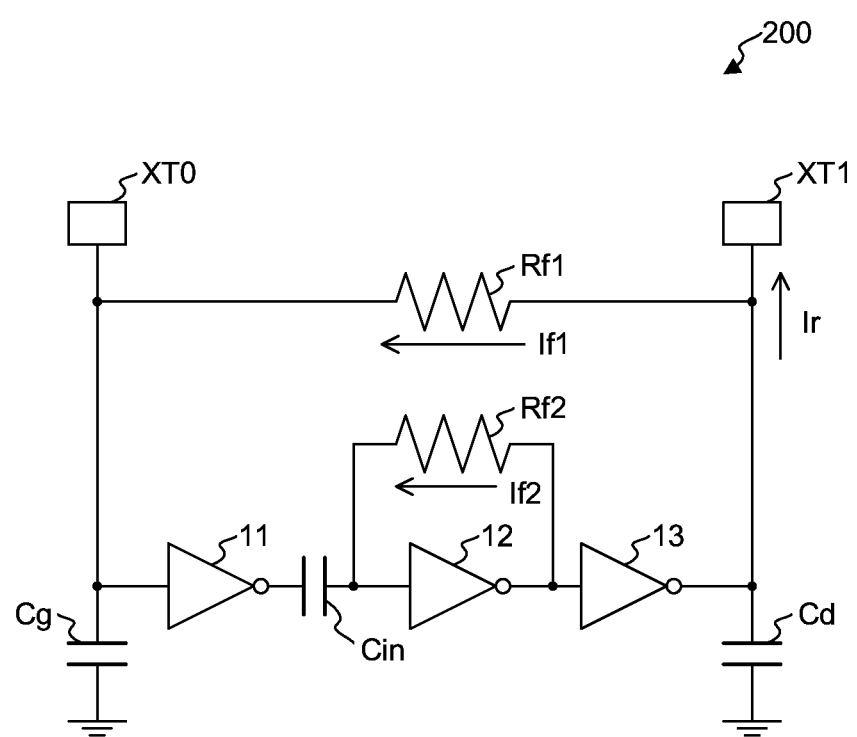
FIG. 13 is a circuit diagram illustrating a configuration of a crystal oscillator circuit of a second embodiment.

Next, the second embodiment of the present invention will be described. FIG. 13 is a circuit diagram illustrating a configuration of a crystal oscillator circuit 200 according to the second embodiment. The crystal oscillator circuit 200 differs from the crystal oscillator circuit 100 of the first embodiment in that a capacitor Cin (also referred to as an input coupling capacitance Cin in the following description) is added between the output terminal of the first inverter 11 and the input terminal of the second inverter 12 (in detail, between a connection node to which the input terminal of the second inverter 12 and one end of the second feedback resistor Rf2 are connected and the output terminal of the first inverter 11).

In the crystal oscillator circuit 200 of this embodiment, a signal output from the first inverter 11 is input to the second inverter 12 via the input coupling capacitance Cin. Operations of the respective units other than that are similar to those of the first embodiment.

In the crystal oscillator circuit 100 of the first embodiment, a magnitude relationship between the conductance gm1 of the first inverter 11 and the conductance gm2 of the second inverter 12 is not only the relationship designed to be "gm1<gm2," but also, for a convenience of, for example, the property of the crystal resonator XTAL and a transistor property of a process, the relationship of "gm1>gm2" is also assumed. In this case, the conductance gm1 of the first inverter 11 affects the conductance gm2 of the second inverter 12 playing a role in main amplification of the crystal oscillator circuit 100 and eventually the amplification factor of the entire circuit. Accordingly, in the negative resistance property of the crystal oscillator circuit 100 of the first embodiment illustrated in FIG. 12, the negative resistance in the case of "gm1>gm2" (1-B in the drawing) becomes lower than the negative resistance in the case of "gm1<gm2" (1-A in the drawing).

Figure 14:
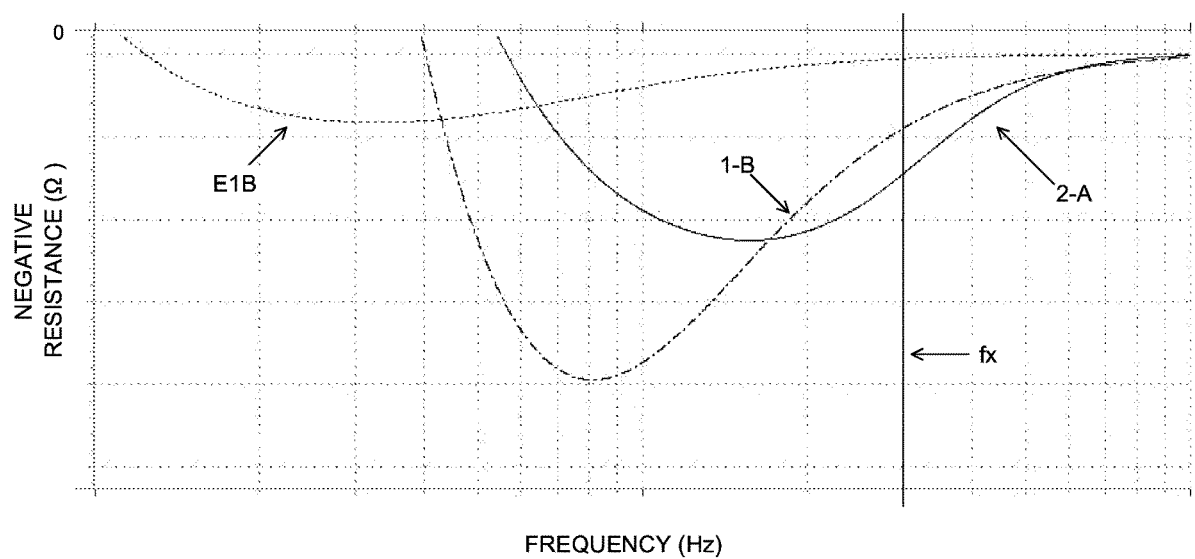
FIG. 14 is a drawing illustrating an example of a property of a negative resistance in the crystal oscillator circuit of the second embodiment.

In contrast to this, FIG. 14 is a drawing illustrating an example of a property of a negative resistance in the crystal oscillator circuit 200 of the second embodiment. In the crystal oscillator circuit 200 of this embodiment, the first inverter 11 and the second inverter 12 are connected via the input coupling capacitance Cin, thus reducing the influence on the amplification factor of the entire circuit by the first inverter 11. Therefore, as indicate by "2-A" in FIG. 14, compared with the case (1-B in the drawing) of the first embodiment in which "gm1>gm2" is met, the negative resistance does not decrease in the crystal oscillator circuit 200 of this embodiment.

Accordingly, with the crystal oscillator circuit 200 of this embodiment, while the influence given by the conductance gm1 of the first inverter 11 is reduced, the crystal oscillator circuit having a high frequency and low current consumption can be provided.

The present invention is not limited to the ones described in the embodiments. For example, the input terminal of the second inverter 12 may be connected to the ground via a capacitor Cg2, and the output terminal of the second inverter 12 may be connected to the ground via a capacitor Cd2.

Figure 15:
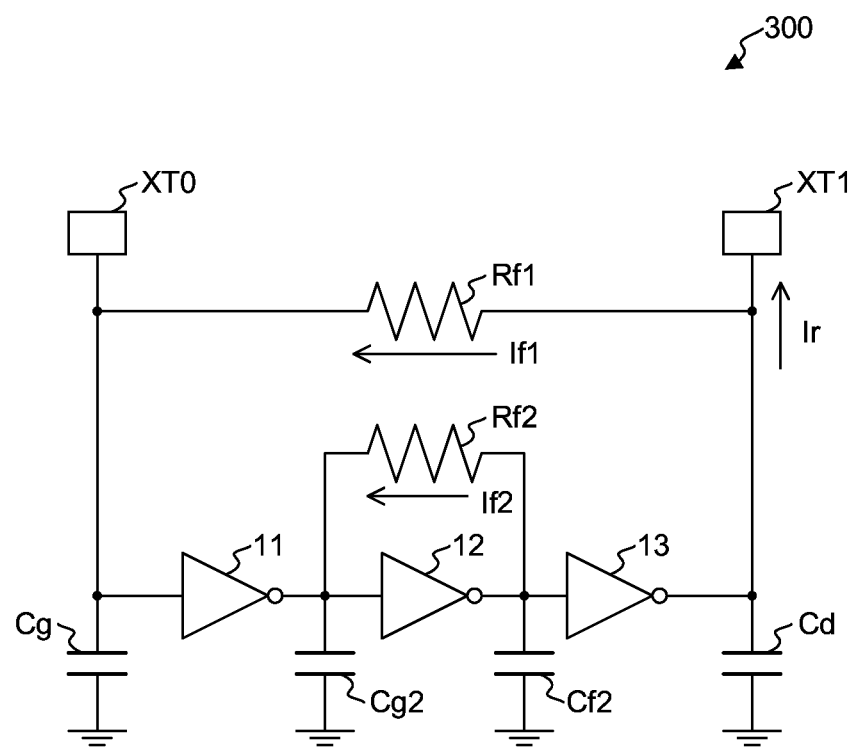
FIG. 15 is a circuit diagram illustrating a configuration of a crystal oscillator circuit of a modification of the first embodiment.
Figure 16:
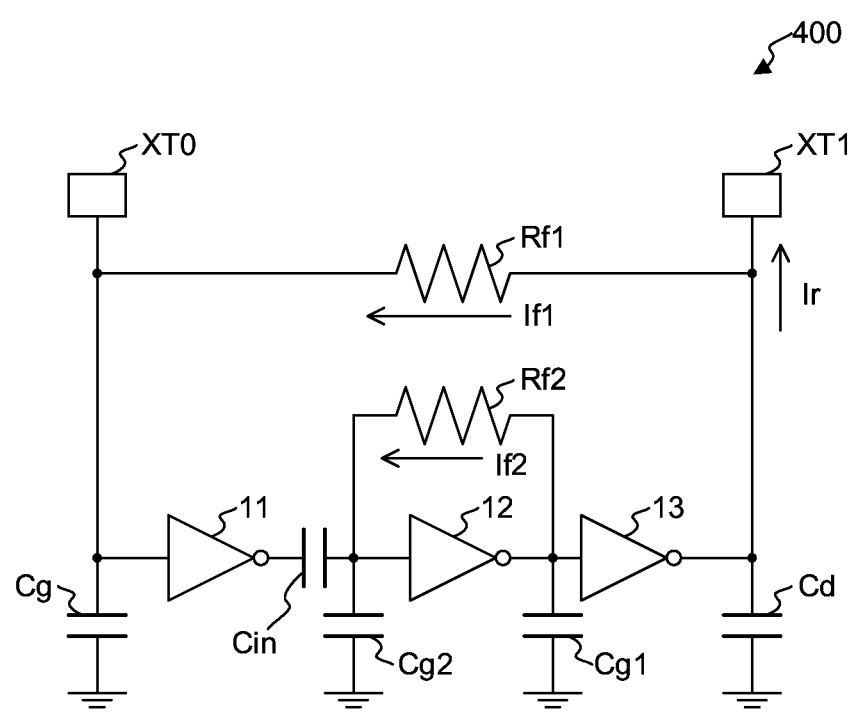
FIG. 16 is a circuit diagram illustrating a configuration of a crystal oscillator circuit of a modification of the second embodiment.

FIG. 15 and FIG. 16 are circuit diagrams illustrating crystal oscillator circuits according to modifications having the configuration. FIG. 15 illustrates a configuration (a crystal oscillator circuit 100A) in which the respective input terminal and output terminal of the second inverter 12 of the crystal oscillator circuit 100 of the first embodiment are connected to the ground via the capacitors Cg2 and Cd2. FIG. 16 illustrates a configuration (a crystal oscillator circuit 200A) in which the respective input terminal and output terminal of the second inverter 12 of the crystal oscillator circuit 200 of the second embodiment are connected to the ground via the capacitors Cg2 and Cd2.

For example, when the resistance value of the second feedback resistor Rf2 is set to be smaller than the resistance value of the first feedback resistor Rf1 (namely, Rf2<Rf1), and the frequency bandwidth of the second inverter 12 is set to be high, in the configuration of not including the capacitors Cg2 and Cd2, the conductance of the entire circuit at the oscillation frequency becomes high, possibly causing abnormal oscillation. However, as in FIG. 15 and FIG. 16, connecting the respective input terminal and output terminal of the second inverter 12 to the ground via the capacitors Cg2 and Cd2 allows adjusting the conductance of the entire circuit at the oscillation frequency and reducing abnormal oscillation.

In the first embodiment and the second embodiment, the case where the amplifying unit is constituted of the inverters of the three stages has been described as an example. However, the number of inverters constituting the amplifying unit is not limited to this, and only needs to be an odd number of three or more.

Figure 17:
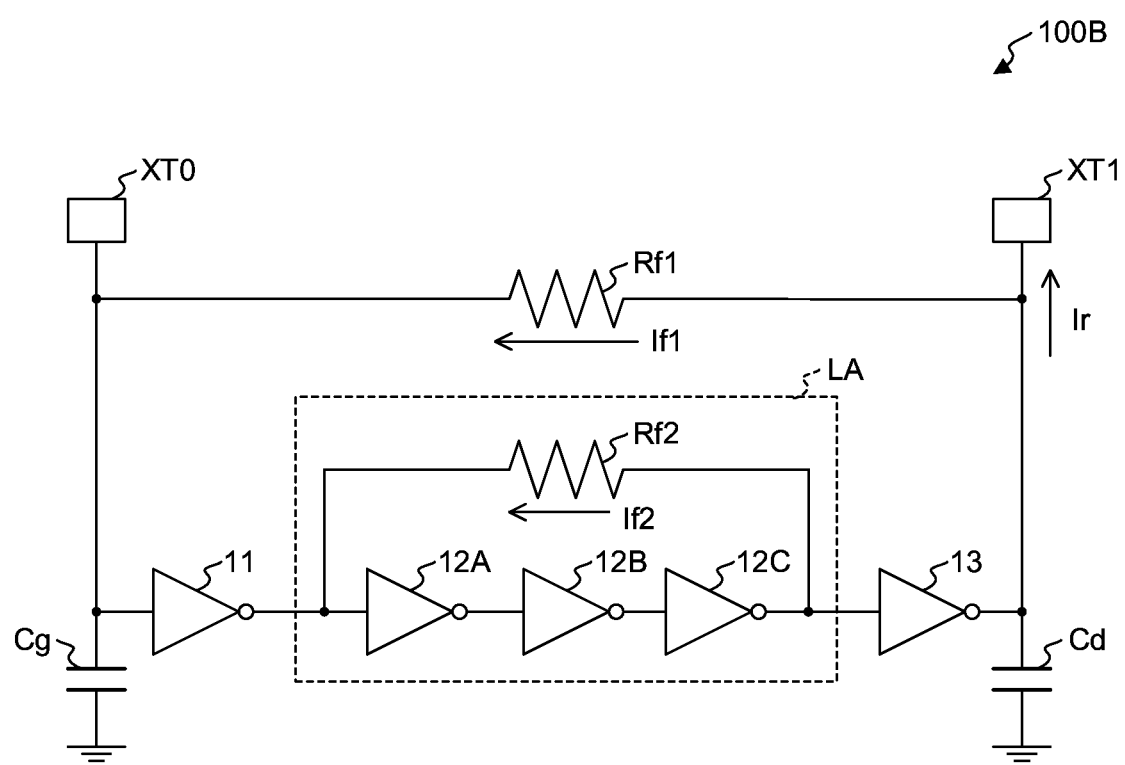
FIG. 17 is a circuit diagram illustrating a configuration of a crystal oscillator circuit of a modification in which the number of stages of inverters is different.

FIG. 17 is a circuit diagram illustrating a configuration in which the number of stages of the amplifying unit is five stages in the crystal oscillator circuit of the first embodiment as a crystal oscillator circuit 100B of the modification. In the crystal oscillator circuit 100B, the linear amplifier LA is constituted of inverters of three stages, inverters 12A, 12B, and 12C. The feedback resistor Rf2 is connected between an output terminal of the inverter 12C and an input terminal of the inverter 12A (that is, between the input terminal of the third inverter 13 and the output terminal of the first inverter 11).

Thus, with the crystal oscillator circuit according to the present invention, the amplifying unit only needs to have the configuration in which the inverter constituting the input stage, the inverter constituting the output stage, and at least one inverter constituting the linear amplifier connected between them are connected in cascade. Then, it is only necessary that the second feedback resistor is connected to the linear amplifier, and the conductance of the linear amplifier has the magnitude larger than the conductance of the first inverter and equal to or less than the conductance of the third inverter.

In each of the crystal oscillator circuit 100 of the first embodiment and the crystal oscillator circuit 200 of the second embodiment, a damping resistor may be connected between the output terminal of the third inverter 13 and the connection terminal XT1. Adding the damping resistor allows restricting the excitation current Ir and reducing the conductance gm (that is, the conductance of the entire amplifying unit 10) of the inverter observed from the crystal resonator XTAL side.

The crystal oscillator circuits of the first embodiment and the second embodiment are applicable to both of a discrete crystal oscillator and a module crystal oscillator. The crystal oscillator circuits of the first embodiment and the second embodiment can be mounted on a substrate board using a standard logic IC, such as 74 HC. The configurations of the crystal oscillator circuits of the first embodiment and the second embodiment are applicable to an oscillator circuit using a ceramic oscillator.

What is claimed is:

1. A crystal oscillator circuit connected to a crystal resonator for oscillating based on an oscillation of the crystal resonator, the crystal oscillator circuit comprising:
   an amplifying unit that includes inverters of odd-numbered stages connected in cascade, the amplifying unit having an input side connected to one end of the crystal resonator and an output side connected to another end of the crystal resonator; and
   a first feedback resistor connected between the one end and the other end of the crystal resonator in parallel to the amplifying unit, wherein
   the amplifying unit includes:
      an inverter at an input stage having an input terminal connected to the one end of the crystal resonator;
      an inverter at an output stage having an output terminal connected to the other end of the crystal resonator; and
      a linear amplifier connected between an output terminal of the inverter at the input stage and an input terminal of the inverter at the output stage, the linear amplifier including at least one inverter and a second feedback resistor which is connected in parallel to the at least one inverter, wherein
   the linear amplifier has a conductance with a magnitude larger than a conductance of the inverter at the input stage and equal to or less than a conductance of the inverter at the output stage.

2. The crystal oscillator circuit according to claim 1, wherein
   the amplifying unit includes an input coupling capacitance connected between the output terminal of the inverter at the input stage and an input terminal of the linear amplifier.

3. The crystal oscillator circuit according to claim 1, wherein
   the second feedback resistor has a resistance value smaller than a resistance value of the first feedback resistor.

4. The crystal oscillator circuit according to claim 1, comprising:
   a first capacitor connected between the input terminal of the inverter at the input stage and a ground; and
   a second capacitor connected between the output terminal of the inverter at the output stage and the ground.

5. The crystal oscillator circuit according to claim 4, comprising:
   a third capacitor connected between an input terminal of the linear amplifier and the ground; and
   a fourth capacitor connected between an output terminal of the linear amplifier and the ground.

* * * * *